United States Patent
Kikuchi

(10) Patent No.: US 10,199,467 B2
(45) Date of Patent: Feb. 5, 2019

(54) SEMICONDUCTOR DEVICE HAVING PLATED METAL IN ELECTRODE AND PROCESS TO FORM THE SAME

(71) Applicant: SUMITOMO ELECTRIC DEVICE INNOVATIONS, INC., Yokohama-shi (JP)

(72) Inventor: Ken Kikuchi, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 0 days.

(21) Appl. No.: 15/010,559

(22) Filed: Jan. 29, 2016

(65) Prior Publication Data

US 2016/0225888 A1  Aug. 4, 2016

(30) Foreign Application Priority Data

Jan. 30, 2015 (JP) ................. 2015-017416

(51) Int. Cl.
*H01L 29/40* (2006.01)
*H01L 29/41* (2006.01)
*H01L 29/45* (2006.01)
*H01L 29/778* (2006.01)
*H01L 29/812* (2006.01)
(Continued)

(52) U.S. Cl.
CPC .......... *H01L 29/401* (2013.01); *H01L 29/452* (2013.01); *H01L 29/7786* (2013.01); *H01L 29/812* (2013.01); *H01L 29/2003* (2013.01); *H01L 2224/11* (2013.01)

(58) Field of Classification Search
CPC .......... H01L 21/0425–21/044; H01L 21/048–21/0495; H01L 21/28–21/28008; H01L 21/28247; H01L 21/28273; H01L 21/283; H01L 21/288; H01L 21/44–21/445; H01L 31/0224; H01L 31/022491; H01L 24/11; H01L 24/13; H01L 2224/0401; H01L 2224/11526;
(Continued)

(56) References Cited

U.S. PATENT DOCUMENTS 5,272,111 A * 12/1993 Kosaki ............... H01L 21/2885
                                                 204/192.25
5,855,993 A *  1/1999 Brady ..................... C23C 18/50
                                                 174/256
(Continued)

FOREIGN PATENT DOCUMENTS

JP  05-275373 A  10/1993
JP  H06-151355 A   5/1994
JP  2013-243173 A 12/2013

*Primary Examiner* — Maliheh Malek
(74) *Attorney, Agent, or Firm* — Venable LLP; Michael A. Sartori; Laura G. Remus

(57) ABSTRACT

A process to form an electrode of a semiconductor device is disclosed. The process includes steps of: forming the first electrode on the semiconductor layer; forming the first insulating film on the first electrode, where the first insulating film provides an opening that exposes a portion of the first electrode but fully covers the semiconductor layer; fully filling the opening by the second electrode; forming the mask so as to expose the second electrode but fully cover the sides of the second electrode; forming the third electrode in a region exposing from the mask; and removing the mask.

7 Claims, 12 Drawing Sheets

(51) Int. Cl.
  *H01L 23/48* (2006.01)
  *H01L 23/488* (2006.01)
  *H01L 23/50* (2006.01)
  *H01L 29/20* (2006.01)
(58) Field of Classification Search
  CPC . H01L 2224/11914; H01L 2224/13006; H01L 2224/13007; H01L 23/48–23/5389
  See application file for complete search history.

(56) References Cited

U.S. PATENT DOCUMENTS

| | | | | |
|---|---|---|---|---|
| 6,111,317 | A * | 8/2000 | Okada | H01L 24/10 257/700 |
| 6,426,281 | B1 * | 7/2002 | Lin | H01L 24/11 257/E21.508 |
| 6,465,879 | B1 * | 10/2002 | Taguchi | H01L 21/563 257/673 |
| 6,596,619 | B1 * | 7/2003 | Wang | H01L 24/03 257/E21.508 |
| 6,622,907 | B2 * | 9/2003 | Fanti | H01L 21/2885 216/18 |
| 6,724,084 | B1 * | 4/2004 | Hikita | H01L 23/49575 257/737 |
| 6,924,553 | B2 * | 8/2005 | Ohara | H01L 23/3171 257/674 |
| 7,935,408 | B2 * | 5/2011 | Daubenspeck | H01L 21/563 174/259 |
| 8,637,861 | B2 * | 1/2014 | Yamazaki | H01L 29/42392 257/43 |
| 9,190,373 | B2 * | 11/2015 | Migita | H01L 21/76885 |
| 9,305,788 | B2 * | 4/2016 | Nishi | H01L 29/66462 |
| 9,620,409 | B2 * | 4/2017 | Kikuchi | H01L 21/765 |
| 9,640,429 | B2 * | 5/2017 | Nishi | H01L 29/66462 |
| 9,673,093 | B2 * | 6/2017 | Hsieh | H01L 21/76879 |
| 2003/0080422 | A1 * | 5/2003 | Ohara | H01L 21/288 257/738 |
| 2004/0007779 | A1 * | 1/2004 | Arbuthnot | H01L 24/11 257/780 |
| 2006/0016861 | A1 * | 1/2006 | Daubenspeck | B23K 3/0623 228/180.21 |
| 2006/0068595 | A1 * | 3/2006 | Seliger | H01L 21/304 438/737 |
| 2006/0231951 | A1 * | 10/2006 | Jan | H01L 24/11 257/737 |
| 2006/0249844 | A1 * | 11/2006 | Yang | H01L 21/563 257/737 |
| 2006/0278982 | A1 * | 12/2006 | Solo De Zaldivar | H01L 24/11 257/737 |
| 2007/0108623 | A1 * | 5/2007 | Jao | H01L 23/3192 257/778 |
| 2008/0001290 | A1 * | 1/2008 | Chou | H01L 23/53238 257/751 |
| 2008/0108189 | A1 * | 5/2008 | Tabatabaie | H01L 29/402 438/197 |
| 2009/0020829 | A1 * | 1/2009 | Chandra | H01L 21/28518 257/384 |
| 2009/0079070 | A1 * | 3/2009 | Lin | H05K 3/3436 257/738 |
| 2009/0108299 | A1 * | 4/2009 | Smorchkova | H01L 29/404 257/194 |
| 2010/0155940 | A1 * | 6/2010 | Kawashita | H01L 21/6835 257/737 |
| 2010/0187685 | A1 * | 7/2010 | Morifuji | H01L 23/3128 257/737 |
| 2011/0223765 | A1 * | 9/2011 | Rajagopalan | C23C 16/345 438/694 |
| 2011/0263084 | A1 * | 10/2011 | Yamazaki | H01L 21/4757 438/161 |
| 2012/0032338 | A1 * | 2/2012 | Komori | H01L 24/11 257/773 |
| 2012/0049343 | A1 * | 3/2012 | Schulze | H01L 24/11 257/737 |
| 2012/0119364 | A1 * | 5/2012 | Vaghela | H01L 24/03 257/750 |
| 2013/0133729 | A1 * | 5/2013 | Mo | H01L 31/022441 136/255 |
| 2013/0313708 | A1 * | 11/2013 | Shigihara | H01L 24/46 257/738 |
| 2014/0120718 | A1 * | 5/2014 | Nishi | H01L 29/66462 438/666 |
| 2014/0252592 | A1 * | 9/2014 | Zhou | H01L 24/03 257/737 |
| 2014/0252593 | A1 * | 9/2014 | Chen | H01L 23/49811 257/737 |
| 2014/0264824 | A1 * | 9/2014 | Lu | H01L 24/81 257/734 |
| 2014/0264859 | A1 * | 9/2014 | Chen | H01L 21/78 257/738 |
| 2014/0291671 | A1 * | 10/2014 | Yamazaki | H01L 21/02554 257/43 |
| 2014/0361431 | A1 * | 12/2014 | Matsumoto | H01L 24/11 257/737 |
| 2015/0008428 | A1 * | 1/2015 | Yamamoto | H01L 29/7869 257/43 |
| 2015/0014838 | A1 * | 1/2015 | Yap | H01L 23/367 257/706 |
| 2015/0060846 | A1 * | 3/2015 | Yamamoto | H01L 21/28194 257/43 |
| 2015/0206767 | A1 * | 7/2015 | Murakami | H01L 21/288 438/612 |
| 2015/0235977 | A1 * | 8/2015 | Shao | H01L 24/14 257/737 |
| 2015/0340505 | A1 * | 11/2015 | Yamazaki | H01L 29/786 438/104 |
| 2015/0372023 | A1 * | 12/2015 | Jintyou | H01L 27/1225 257/43 |
| 2016/0133592 | A1 * | 5/2016 | Okumura | H01L 24/13 257/738 |
| 2016/0190330 | A1 * | 6/2016 | Yamazaki | H01L 29/7869 257/43 |
| 2016/0233343 | A1 * | 8/2016 | Miyairi | H01L 29/4236 |
| 2016/0247772 | A1 * | 8/2016 | Nishi | H01L 24/03 |
| 2016/0254761 | A1 * | 9/2016 | Furukawa | H01L 25/16 363/131 |
| 2016/0351473 | A1 * | 12/2016 | Uchida | H01L 23/481 |
| 2017/0141268 | A1 * | 5/2017 | Cich | H01L 33/32 |
| 2017/0179055 | A1 * | 6/2017 | Lin | H01L 24/08 |
| 2017/0194274 | A1 * | 7/2017 | Baloglu | H01L 24/81 |
| 2017/0201073 | A1 * | 7/2017 | Futagawa | H01S 5/18361 |
| 2017/0236954 | A1 * | 8/2017 | Kramer | H01L 31/022458 136/256 |
| 2017/0256512 | A1 * | 9/2017 | Tu | H01L 23/3114 |
| 2017/0279020 | A1 * | 9/2017 | Kim | H01L 33/62 |
| 2017/0365571 | A1 * | 12/2017 | Matsuda | H01L 24/13 |
| 2018/0166618 | A1 * | 6/2018 | Kim | H01L 33/62 |
| 2018/0190606 | A1 * | 7/2018 | Williamson | H01L 23/562 |
| 2018/0294186 | A1 * | 10/2018 | Lam | H01L 21/76837 |

* cited by examiner

SEMICONDUCTOR DEVICE HAVING PLATED METAL IN ELECTRODE AND PROCESS TO FORM THE SAME

BACKGROUND OF THE INVENTION

1. Field of the Invention

The present invention relates to a process to produce a semiconductor device, in particular, those having electrodes formed on a semiconductor layer.

2. Background Arts

Electronic semiconductor devices inevitably provide ohmic electrodes on a semiconductor layer. A Japanese Patent Application with a laid open number JP-H05-275373A has disclosed a process for a semiconductor device where the process first forms an ohmic electrode on a semiconductor layer, covers the ohmic electrode with an insulating film, forms an opening in the insulating film in a portion on the ohmic electrode, and finally forms an interconnection connected to the ohmic electrode by plating. The plated metal not only fully covers the opening in the insulating film but extends on the insulating film in portions adjacent to the opening.

When the plated metal in a bottom edge thereof has an overhung side surface, namely, an undercut against layer beneath the plated metal, an insulating film or a passivation film covering the plated metal is hard to be in contact to a deep end of the overhung plated metal, which may degrade long-term reliability of the plated metal, and the semiconductor device providing such plated metal and the passivation film. The present invention is to provide a solution to enhance the coverage of the overhung metal with the insulating film.

SUMMARY OF THE INVENTION

An aspect of the present application relates to a method to produce a semiconductor device. The method includes steps of: (a) forming a first electrode on a semiconductor layer; (b) forming a first insulating film on the first electrode, where the first insulating film has an opening through which the first electrode exposes; (c) forming a second electrode on a portion of the first electrode exposed within the opening and a portion of the first insulating film around the opening of the first insulating film, the second electrode extending in a periphery of the opening of the first insulating film; (d) forming a mask on the first insulating film and a portion of the second electrode extended in the periphery of the first insulating film, where the mask has an opening in a portion of the second electrode but covers an edge of the second electrode; (e) forming a third electrode on the mask and the second electrode exposed from the mask; and (f) exposing the edge of the second electrode by removing the mask; and (g) covering the third electrode and the edge of the second electrode by a second insulating film.

In the process of the present invention, because the process includes steps of forming the second electrode and exposing the edge thereof after forming the third electrode, the undercut formed under the edge of the third electrode against the first insulating film may be reduced in an aspect ratio thereof, that is, the undercut may be formed relatively shallower.

Another aspect of the present application relates to arrangements of a semiconductor device that includes a semiconductor layer, a first electrode on the semiconductor layer, a first insulating film, a second electrode, a third electrode, and a second insulating film. The first insulating film covers the semiconductor layer and a periphery of the first electrode so as to form an opening through which the first electrode exposed. The second electrode fills the opening of the first insulating film and extends in a periphery of the opening so as to have an edge on the first insulating film. The third electrode covers a top of the second electrode. The second insulating film covers the third electrode and the edge of the second electrode. A feature of the semiconductor device of the present invention is that the third electrode in a bottom edge thereof in contact to the second electrode is aligned with a top edge of the second electrode.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present application will be described as referring to drawings. In the description of the drawings, numerals or symbols same with or similar to each other will refer to elements same with or similar to each other without duplicated explanations.

First Embodiment

Figure 1A:
FIGS. 1A to 1E show cross sections of a semiconductor device at respective steps of the process to from thereof according to the present application.

FIGS. 1A to 6B show cross sections of a semiconductor device at respective steps of the manufacturing process according to the first embodiment of the present application. The process according to the first embodiment first deposits an insulating film 12 on a semiconductor layer 10, then, forms an opening in the insulating film 12, which is shown in FIG. 1A. The semiconductor layer 10 may include a buffer layer made of AlN, a channel layer made of GaN, and a barrier layer made of AlGaN, where these layers are grown on a semiconductor substrate made of GaN, SiC, Si, and/or sapphire ($Al_2O_3$). The semiconductor layer 10 may be collectively called as a nitride semiconductor layer including at least one of GaN, AlGaN, InGaN, InAlN, and InAlGaN. Alternatively, the semiconductor layer 10 may be made of GaAs and/or semiconductor materials involved within a group of GaAs, which means that those semiconductor materials in the group have lattice constants substantially equal to that of GaAs, or within a range around that of GaAs where an epitaxial growth the semiconductor materials may be carried out. The insulating film 12, which may be made of silicon nitride (SiN), has a thickness of 20 to 80 nm formed by the chemical vapor deposition (CVD). The opening provided in the insulating film 12 may be formed by a dry-etching.

Figure 1B:
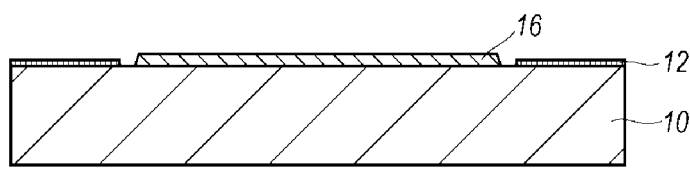

The process next forms an ohmic electrode 16 within the opening as shown in FIG. 1B. The ohmic electrode 16 may be made of stack of titanium (Ti) with a thickness of 20 nm and aluminum (Al) with a thickness of 500 nm from the side of the semiconductor layer 10. The materials and thicknesses of respective metals are optional depending on the composition of the semiconductor layer 10.

Figure 1C:
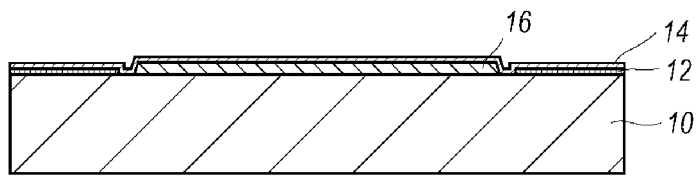

Next, another insulating film 14 covers the ohmic electrode 16, the insulating film 12, and a surface of the semiconductor layer 10 exposed between the insulating film 12 and the ohmic electrode 16, which is shown in FIG. 1C. The other insulating film 14 may be made of also silicon nitride (SiN) with a thickness of 20 to 80 nm formed by the CVD technique.

Figure 1D:
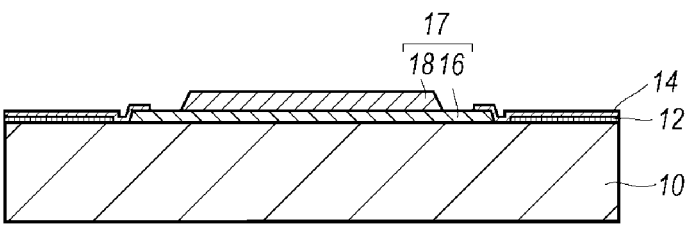

The process next forms a barrier metal 18 on the ohmic electrode 16, as shown in FIG. 1D. The barrier metal 18, which may be made of at least one of titanium (Ti), titanium tungsten (TiW), titanium nitride (TiN), and titanium tungsten nitride (TiWN), prevents atoms in the ohmic electrode 16 and an electrode to be formed on the ohmic electrode 16 from inter-diffusing. One example of the barrier metal 18 is a stack of titanium (Ti) with a thickness of 20 nm and titanium nitride (TiN) with a thickness of 30 nm from the side of the ohmic electrode 16. The barrier metal 18 may be formed by, for instance, sputtering those metals and subsequent dry-etching. The barrier metal 18 covers a center portion of the ohmic electrode 16 as exposing peripheries thereof so as not to overlap with the insulating film 14 extending on the ohmic electrode 16. The barrier metal 18 overlapping with the insulating film 14 sometimes causes cracks in the insulating film 14 due to stress applied from the barrier metal 18. Also, the barrier metal 18 overlapped not only with the ohmic electrode 16 but the insulating film 14 forms a large step in insulating films, 20 and 22, to be formed thereon. Thus, the barrier metal 18 is preferably formed apart from the insulating film 14. This arrangement of the barrier metal 18 and the insulating film 14 exposes the ohmic electrode 16 therebetween. A size of the exposed area in the ohmic electrode 16 fully depends on the lithographical tolerance of the barrier metal 18 and that of the insulating film 14. The ohmic electrode 16 and the barrier metal 18 constitute the first electrode 17. When the inter-diffusion of atoms described above is practically out of consideration, the barrier metal 18 may be omitted.

Figure 1E:
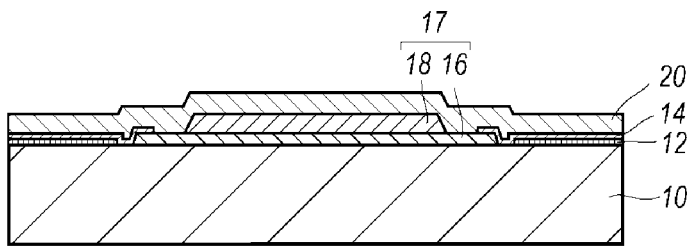

The process next forms another insulating film 20 so as to cover the first electrode 17 as shown in FIG. 1E. The insulating film 20 may be made of silicon nitride (SiN) with a thickness to 200 to 600 nm formed by the CVD technique.

Subsequently, an additional insulating film 22 is formed on the former insulating film 20. The insulating film 22 may be made of silicon nitride (SiN) with a thickness of 100 to 400 nm and also formed by the CVD technique. In a modification, an electrode generally called as a source wall and/or a field plate may be put between two insulating films, 20 and 22. These two insulating films, 20 and 22, constitute the first insulating film 21. In an alternative, the insulating film 22 may be omitted. The first insulating film 21 has a thickness greater than that of the insulating film 14 covering the peripheries of the ohmic electrode 16. Although not illustrated in figures, the insulating film 14 is to be formed with an opening for the gate electrode. In order to shorten the gate length, the insulating film 14 is preferably formed thin to enhance the preciseness and the stability of the manufacturing process. On the other hand, because the first insulating film 21 is to protect or passivate surfaces of the semiconductor device, the insulating film 21 is preferably formed relatively thicker.

Figure 2A:
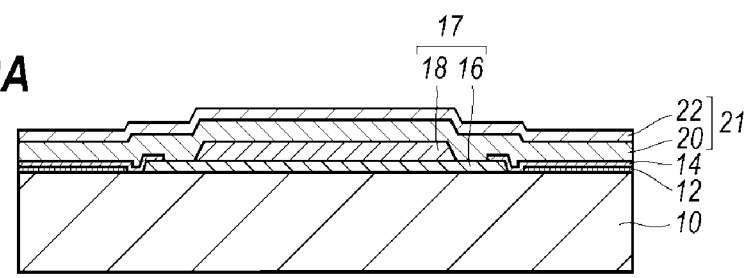
FIGS. 2A to 2C show cross sections of the semiconductor device at respective steps of the process subsequent to that shown in FIG. 1E.
Figure 2B:
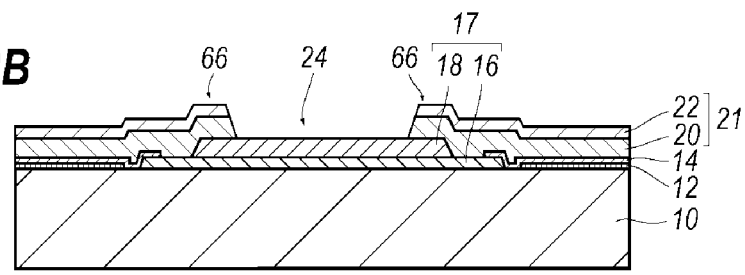

The process next forms an opening 24 in the first insulating film 21 by, for instance, dry-etching as shown in FIG. 2B. The opening 24 traces the boundary of the barrier metal 18 so as to fully cover the portion of the ohmic electrode 16 exposed between the barrier metal 18 and the insulting film 14. Thus, even when the barrier metal 18 exposes the ohmic electrode 16, the electrode 29 to be formed later in the process is not in contact to the ohmic electrode 16 because the first insulating film 21 covers the exposed portion of the ohmic electrode 16, which may effectively enhance the reliability, in particular, the long-term reliability of the semiconductor device. In order to fully cover the ohmic electrode 16 by the first insulating film 21, the opening 24 in the periphery thereof is necessary to be within the periphery of the barrier metal 18, which means that the first insulating film 21 having a thickness thereof greater than the thickness of the insulating film 14 is stacked on the periphery of the barrier metal 18. Accordingly, the first insulating film 21 forms a large mound 66 along in periphery of the barrier metal 18. Thus, the first insulating film 21 forms the mound 66 along the periphery of the barrier metal 18 and the opening 24 within the mound 66. Even when the ohmic electrode 16 accompanies with no barrier metal 18, the first insulating film 21 extends on the periphery of the first electrode 17 and the mound 66 may be formed on the first insulating film 21.

Figure 2C:
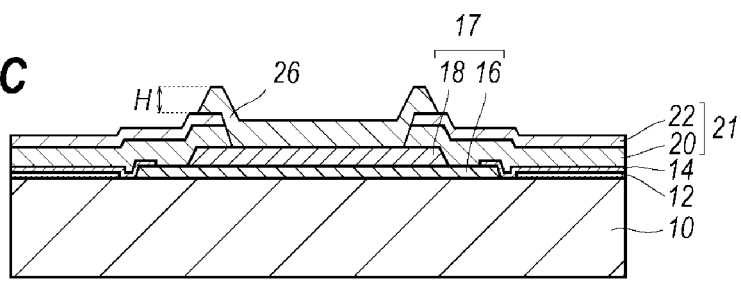

Next, the process forms an electrode 26 so as to fill the opening 24 as shown in FIG. 2C. The electrode 26, which is made of gold (Au) with a thickness of 1 to 3 μm, may be formed by the vacuum evaporation and subsequent lift-off technique. The electrode 26 may have a composite arrangement with a base metal, typically made of titanium (Ti), in contact to the barrier metal 18. The electrode 26 has tapered edge with a top narrower than a bottom thereof. Also, the electrode 26 in a portion thereof covers the first insulating film 21 along the periphery of the opening 24, that is, the electrode 26 extends on the first insulating film 21 in a region along the periphery of the opening 24. Accordingly, the top level of the electrode 26 becomes higher than the top level of the mound 66 by an amount H. When the electrode 26 has a thickness of about 1 μm in the opening 24, the height H also becomes about 1 μm. The electrode 26 will be called hereinafter as the second electrode.

Figure 3A:
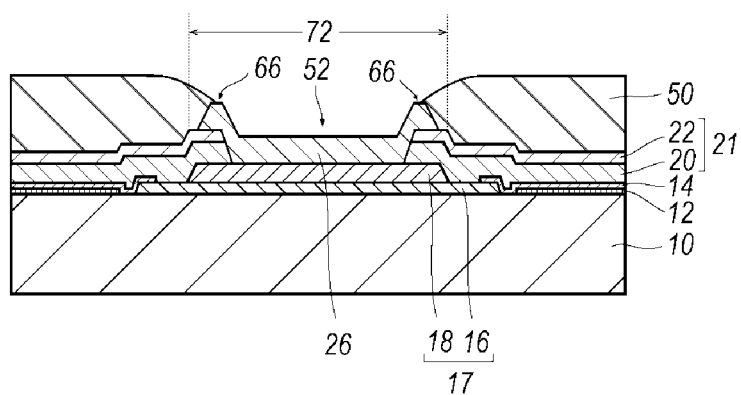
FIGS. 3A and 3B show cross sections of the semiconductor device at respective steps of the process subsequent to that shown in FIG. 2C.
Figure 3B:
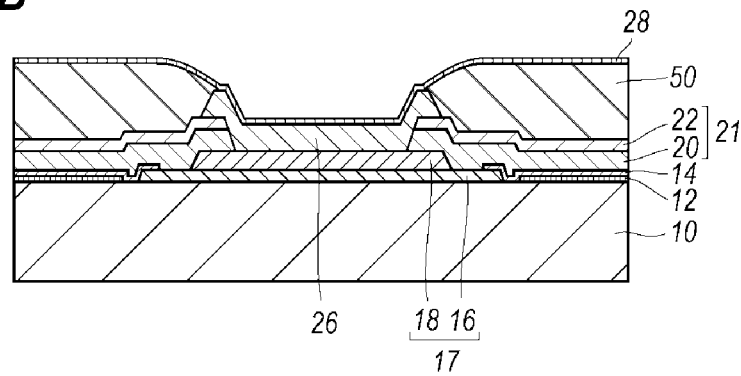

Next, the process forms a mask 50 on the first insulating film 21 as shown in FIG. 3A. The mask 50 covers at least a portion of outer side surfaces of the mound 66 and provides an opening 52 that exposes the top of the electrode 26. In the present embodiment, the mask 50 fully covers the outer edge, but partly covers the outer side of the top of the mound 66 of the electrode 26, and is dulled toward the opening 52. The mask 50 may be made of photoresist and formed by ordinary photolithography process of the coating, the exposure, and the developing. The opening 52 may be formed inside of the outer periphery of the mound 66 of the first insulating film 21, that is, a diameter or a width of the opening 52 is smaller than an outer diameter or a width of the mound 66 of the first insulating film 21. Details of the mask 50, in particular dimensions thereof, will be described later.

Figure 4A:
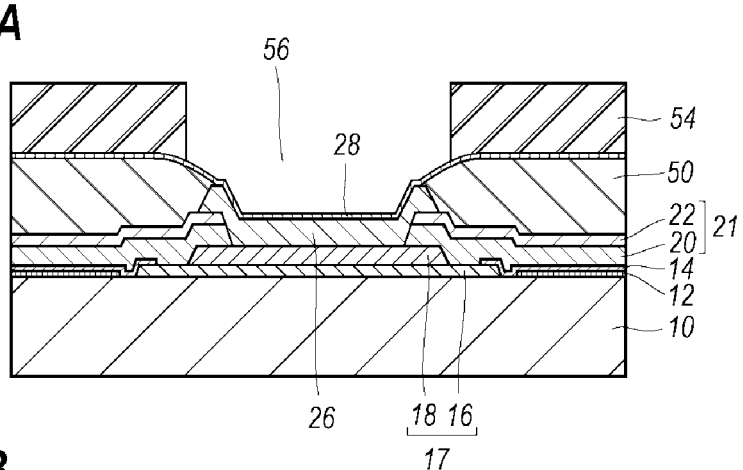
FIGS. 4A and 4B show cross sections of the semiconductor device at respective steps of the process subsequent to that shown in FIG. 3B.
Figure 4B:
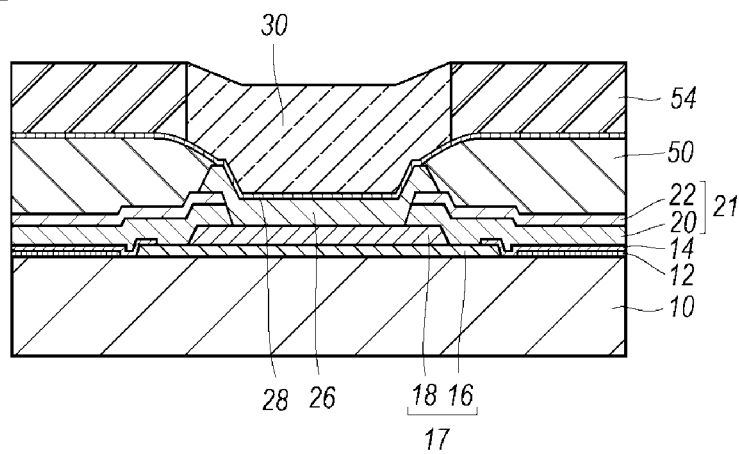

The process of the embodiment next covers the top of the mask 50 and that of the second electrode 26 exposed within the opening 52 by a seed metal 28. The seed metal 28 may be made of composite metal including titanium (Ti) with a thickness of 10 nm and gold (Au) with a thickness of 20 nm, both of which may be deposited by the vacuum evaporation and/or the sputtering. Then, another mask 54 is formed on the seed metal 28 as shown in FIG. 4A. The latter mask 54 also provides an opening 56 with a size greater than the size of the electrode 26 exposed within the opening 52 of the former mask 50. The side of the mask 54 exposed in the opening 56 may be formed steeper compared with the dulled side of the former mask 50. The latter mask 54 may be also made of photoresist and the opening 56 may be formed by the conventional lithography technique of the coating, the exposure, and the developing. The opening 56 in a size or a diameter thereof is greater than the size or the diameter of the opening 52 and fully overlaps with the former opening 52. Next, the opening 56 is filled with a plated metal 30 as shown in FIG. 4B. The plated metal may be made of gold (Au) with a thickness of 2 to 4 μm and formed by the electrolytic plating. The seed metal 28 secures the current path for the electrolytic plating.

Figure 5A:
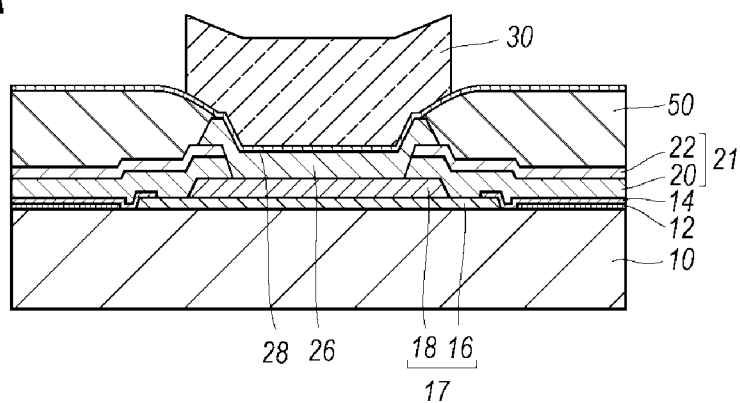
FIGS. 5A and 5B show cross sections of the semiconductor device at respective steps of the process subsequent to that shown in FIG. 4B.
Figure 5B:
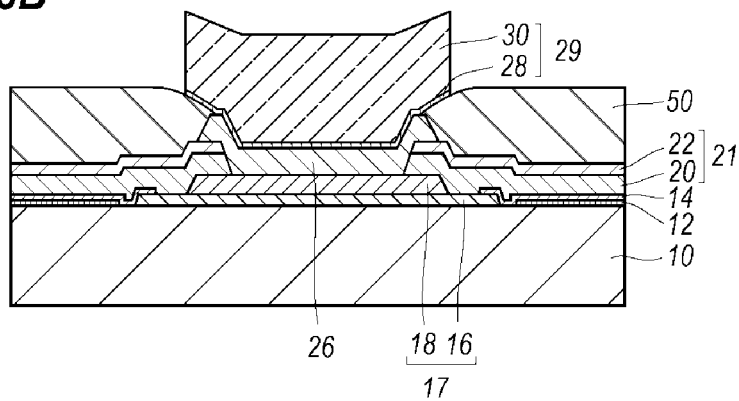

Next, the process sequentially removes the top mask 54 and the seed metal 28 exposed from the mask 54 as shown in FIGS. 5A and 5B. The reactive ion etching and/or the ion milling may remove the seed metal 28. Thus, the third electrode 29 including the seed metal 28 and the plated metal 30 may be formed. Because the opening 56 in the second mask 54 is greater than the former opening 52 of the first mask 50, the first insulating film 21 does not appear during the removal of the seed metal 28. When the opening 56 is formed smaller than the opening 52, the first insulating film 17 is possibly etched during the removal of the seed metal 28.

Figure 6A:
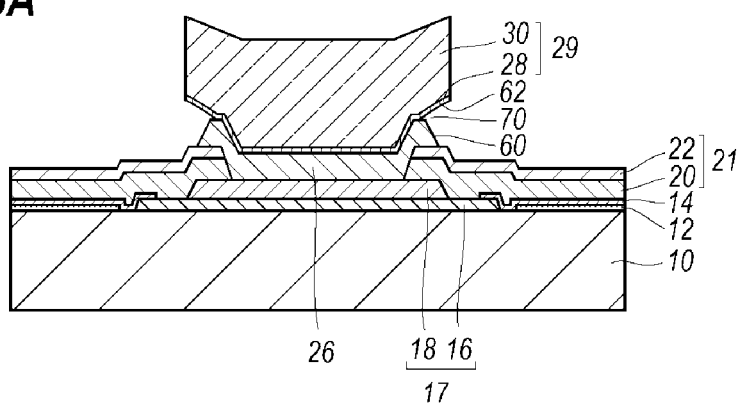
FIGS. 6A and 6B show cross sections of the semiconductor device at respective steps of the process subsequent to that shown in FIG. 5B.
Figure 6B:
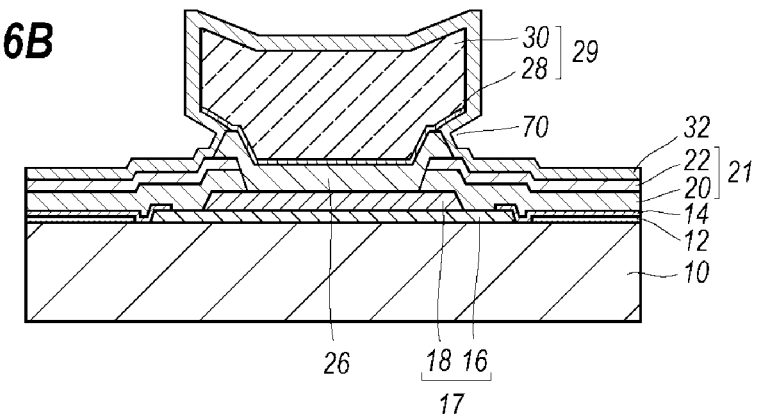

Next, the process removes the former mask 50 as shown in FIG. 6A. As described, because the opening 56 in the second mask 54 is greater than the opening 52 in the first mask 50, the third electrode 29 has an overhung bottom surface 62, or forms an undercut against the first insulating film 21 with eaves 62 in the periphery thereof. The eaves 62 continues the tapered side 60 of the second electrode 26 so as to form the undercut 70 between the eaves 62 of the third electrode 29 and the tapered side surface 60 of the second electrode 26.

Finally, the process covers the second electrode 26 and the third electrode 29 by an insulating film 32. Specifically, the insulating film 32 passivates the side 60 of the second electrode 26, the third electrode 29 including the top, the side, and the eaves 62 thereof, and the top of the first insulating film 21. The insulating film 32 will be called as the second insulating film, or the passivation film. The passivation film 32 may be made of silicon nitride (SiN) with a thickness of 200 to 800 nm and formed by the chemical vapor deposition (CVD) technique.

Figure 7:
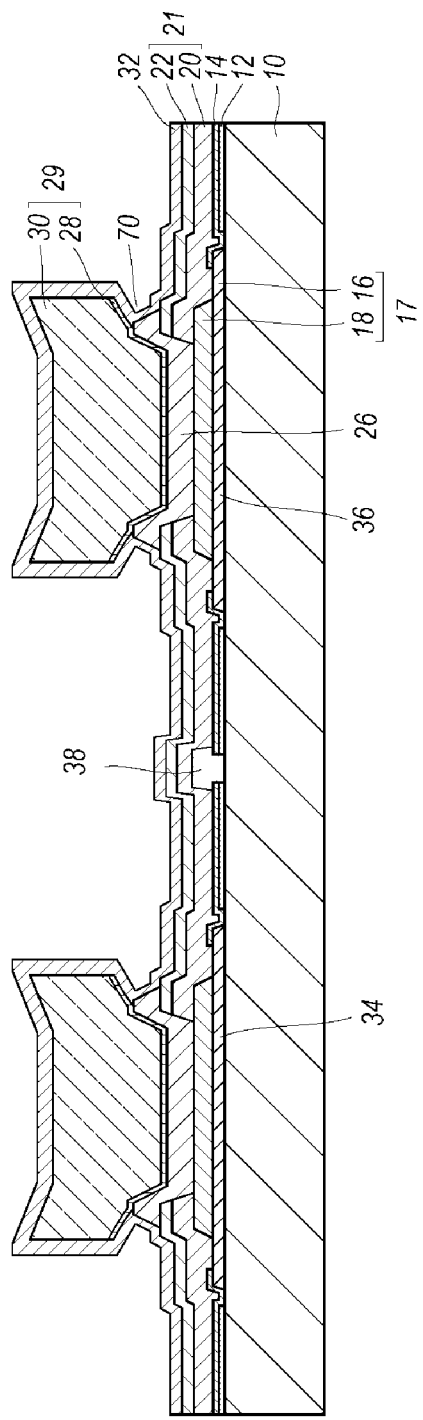
FIG. 7 shows a cross section of the semiconductor device at the step completing the process of producing the device according to the present application.

FIG. 7 shows a cross section of the semiconductor device thus formed by the process according to the first embodiment. The ohmic electrode 16 is for the source and drain electrodes, 34 and 36, of the semiconductor device. Also, the semiconductor device provides, between the source and drain electrodes, 34 and 36, a gate electrode 38 made of, for instance, stacked metal including nickel (Ni) and gold (Au) from the side of the semiconductor layer 10. The gate electrode 38 is directly in contact to the semiconductor layer 10 through an opening formed in the insulating films, 12 and 14. The first insulating film 21 and the passivation film 32 cover the gate electrode 38. Arrangements around the source and drain electrodes, 34 and 36, are same with those described above as referring to FIGS. 1A to 6B.

Figure 8:
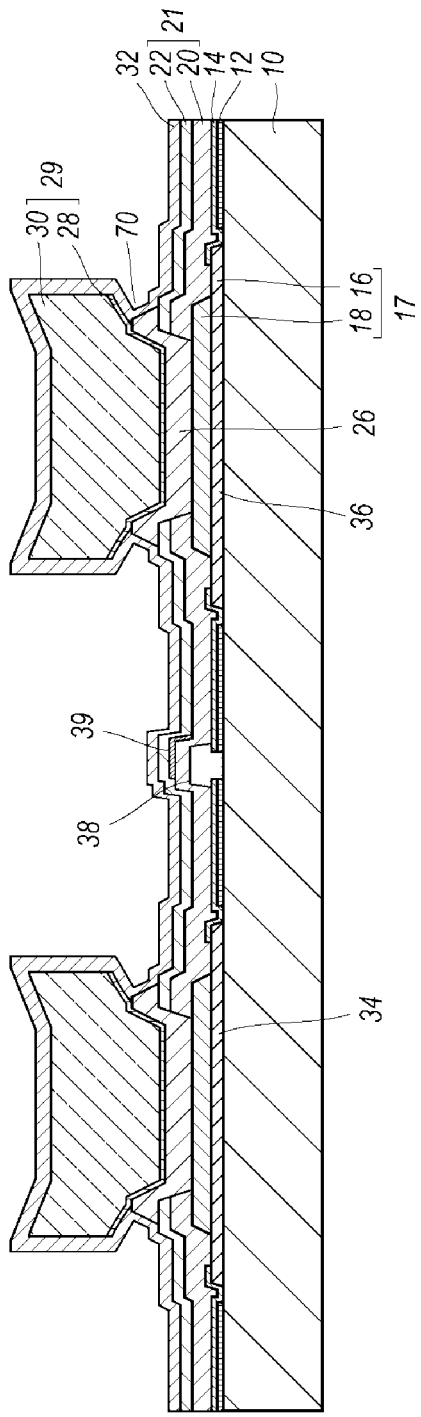
FIG. 8 shows a cross section of a semiconductor device modified from the semiconductor device whose cross section is illustrated in FIG. 7.

FIG. 8 shows a cross section of the semiconductor device according to another embodiment of the present invention. The semiconductor device shown in FIG. 8 provides an additional electrode 39 between two insulating films, 20 and 22, close to the gate 38 and in the side of the drain 36. Other arrangements of the semiconductor device shown in FIG. 8 are substantially same with those shown in FIG. 7.

Figure 9A:
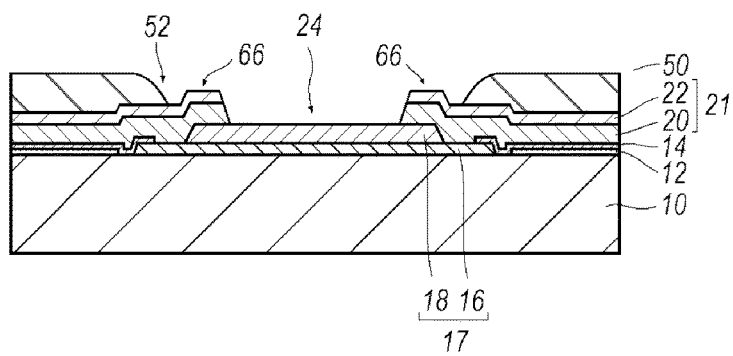
FIGS. 9A to 9C show cross sections of a semiconductor device at respective steps of a manufacturing process according to the second embodiment of the present application.
Figure 9B:
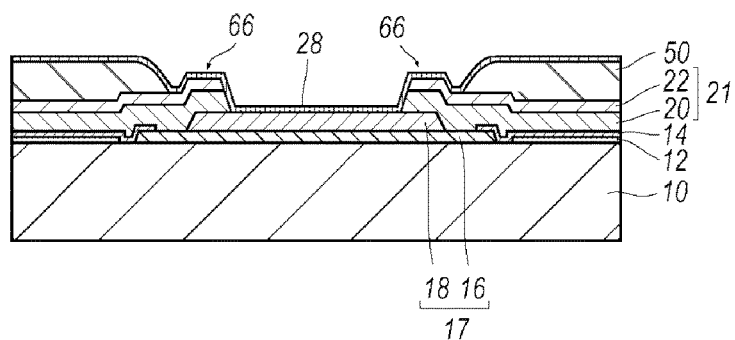
Figure 9C:
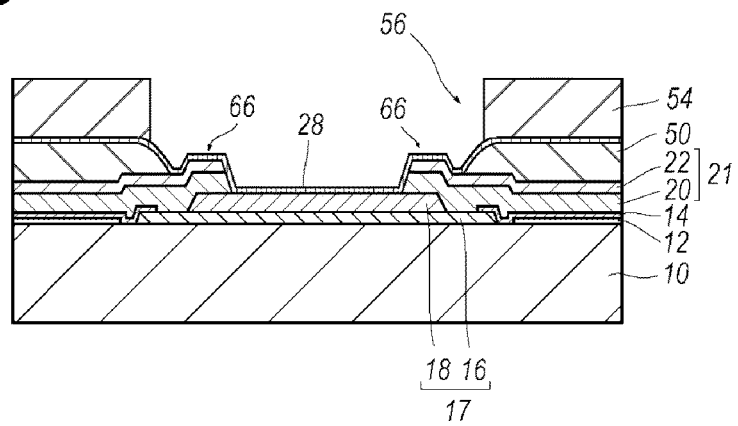

A semiconductor device will be compared with the semiconductor device 10 of the present invention as referring to FIGS. 9A to 10C, which show respective steps of the process to produce the semiconductor device comparable to the present invention. As shown in FIG. 9A, the comparable process forms a mask 50 without forming the second electrode 26 on the first insulating film 21 after the step shown in FIG. 2B of the present embodiment. The step shown in FIG. 9A is similar to the step shown in FIG. 3A. The mask 50 shown in FIG. 9A also provides the opening that overlaps with the opening 24 formed in the first insulating film 21. Next, similar to the step shown in FIG. 3B, the process forms the seed metal 28 on the barrier metal 18 exposing in the opening 24 and on the mask 50. Next, similar to the step shown in FIG. 4A, the additional mask 54 is formed on the seed metal 28. The mask 54 also provides the opening 56 that overlaps with the former opening in the lower mask 50.

Figure 10A:
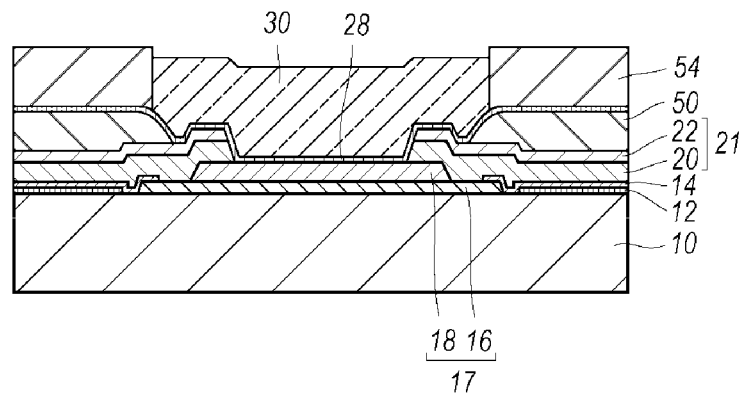
FIGS. 10A to 10C show cross sections of the semiconductor device at respective steps of the process subsequent to that shown in FIG. 9C.
Figure 10B:
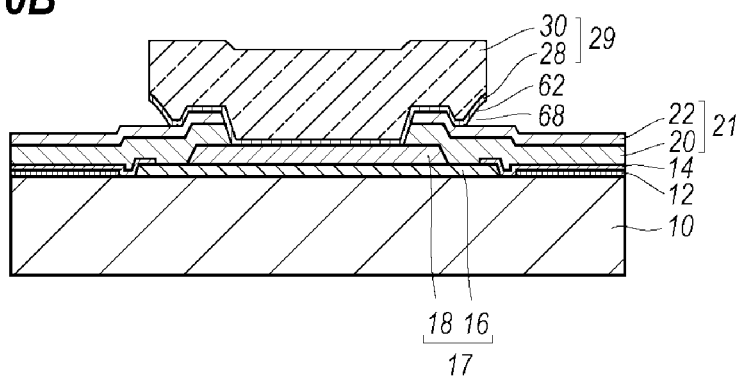
Figure 10C:
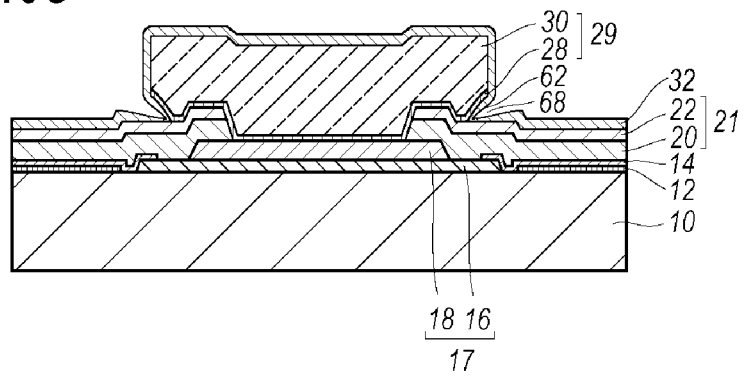

The plated metal 30 fills the opening 56 as shown in FIG. 10A, which is similar to the step shown in FIG. 4B. Removing the upper mask 54, the seed metal 28 exposed by the removal of the upper mask 54, and the lower mask 50 exposed by the removal of the seed metal 28, the third electrode 29 including the plated metal 30 and the seed metal 28 may be formed as shown in FIG. 10B. Lastly, an insulating film 32 fully covers the third metal 29 and the first insulating film 21 to passivate the semiconductor device as shown in FIG. 10C.

Figure 11A:
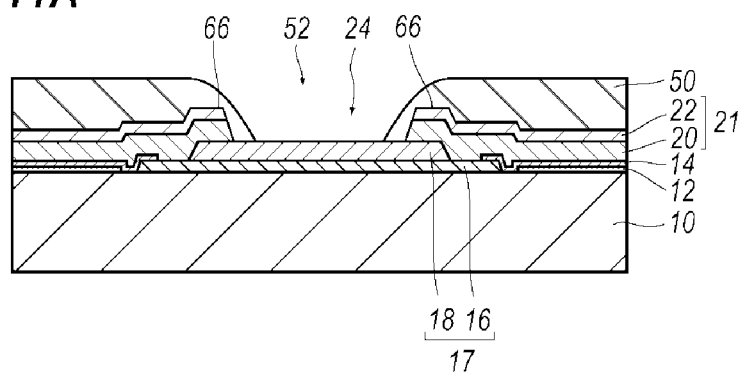
FIGS. 11A to 11C show cross sections of the semiconductor device at respective steps of the process subsequent to that shown in FIG. 10C.
Figure 11B:
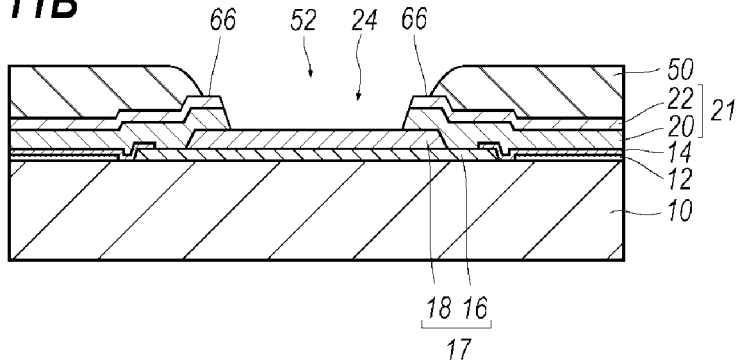
Figure 11C:
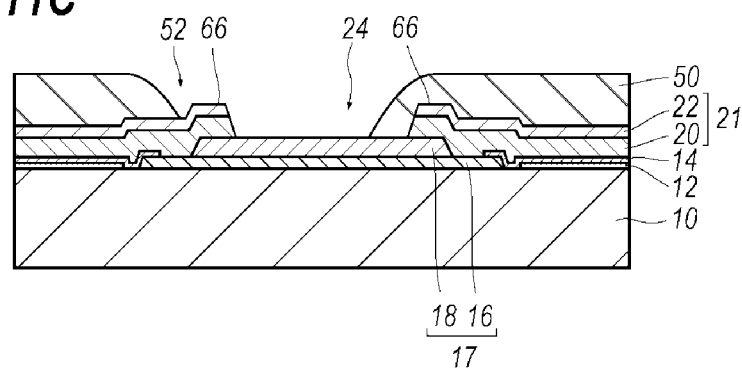

In the process comparable to the present invention, as shown in FIG. 9A, the opening 52 in the mask 50 exposes the mound 66, or includes the mound 66 therein. The reason why the opening 52 includes the mound 66 is as follows. FIGS. 11A to 11C show processes for producing a semiconductor device comparable to the semiconductor device of the present invention. As shown in FIG. 11A, when the opening 52 is involved within the opening 24 of the first insulating film 21, that is, the opening 52 excludes the mound 66, the mask 50 extends on the barrier metal 18, which means that the portions covered by the mask 50 exclude the plated metal 30. Accordingly, in such a case, a gap will be left between the plated metal 30 and the first insulating film 21, through which moisture possibly penetrates within the barrier metal 18 and the semiconductor layer 10, which degrades the long-term reliability of the semiconductor device.

Accordingly, the mask 50 in the edge of the opening 52 is at least necessary to be positioned on the mound 66 as shown in FIG. 11B. However, the process for forming the mask 50, or patterning the opening 52, becomes complex because the opening 52 is necessary to be overlapped with the opening 24 of the first insulating film 21, or, the edge of the opening 52 is aligned with the edge of the opening 24. When the opening 52 is misaligned with the opening 24, the edge of the opening 52 possibly extends within the opening 24 as shown in FIG. 11C. In such a case, the gap is inevitably left between the plated metal 30 and the first insulating film 21 similar to the case shown in FIG. 11A.

Figure 12:
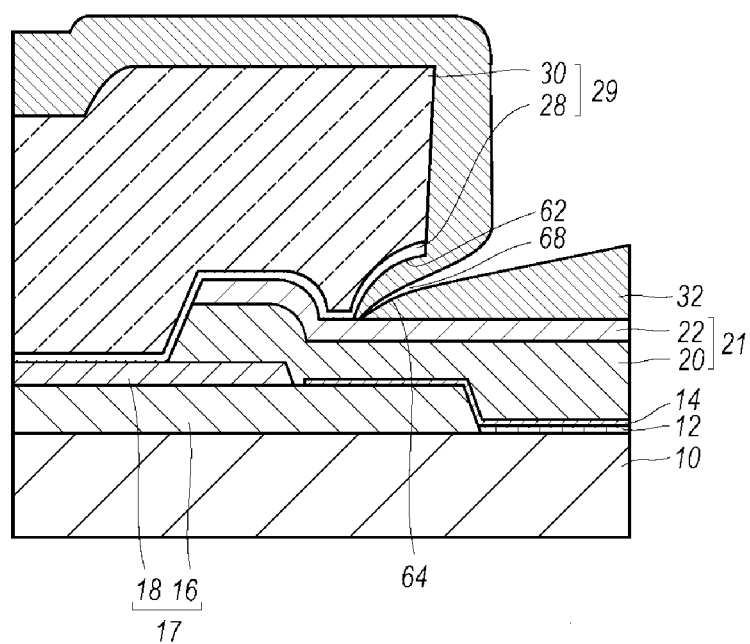
FIG. 12 magnifies a primary portion of the semiconductor device at the step shown in FIG. 10C.

Thus, in order to avoid the case where the mask 50 extend on the first electrode 17 exposed from the first insulating film 21, the opening 52 is necessary to be wide enough to securely cover the mound 66 of the first insulating film 21 as shown in FIG. 9A. In such a case, the eaves 62 of the third electrode 29 locate on the first insulating film 21. FIG. 12 magnifies the eaves portion 62 of the third electrode 29. As shown in FIG. 12, the third electrode 29 and the first insulating film 21 form an undercut 68 with a substantial aspect ratio, that is, the undercut 68 has a deep and narrow end. The aspect ratio of the undercut 68 may be determined by an edge shape of the mask 50, which is one of the key factors for the seed metal 28 to cover the mask 50 and to attach thereto securely. Also, the mask 50 is preferably to be formed thinner because the dulled edge of the mask 50 inevitably results in a wider electrode. When the mask 50 has a thickness comparable to that of the mask 54 later formed thereon and the edge shape is formed in dull, the plated metal 30 is formed in wider, which becomes contrary to a permanent request to form the semiconductor device smaller. Thus, the mask 50 with a dulled edge and a lesser thickness causes a greater aspect ratio of the undercut 68. Such an undercut results in a thinner passivation film 32 and also a degraded film quality such as lesser film density and/or slits. Moisture easily penetrates into the inner layers through portions of the passivation film 32 accompanied with lesser thicknesses, degraded quality, and slits; and the long-term reliability of the semiconductor device deteriorates.

On the other hand, the semiconductor device of the first embodiment according to the present invention provides the second electrode 26 on the barrier metal 18; and the mask 50 is formed so as to cover the sides of the second electrode 26 when the opening 52 is patterned. The undercut 70 by the third electrode 29 may have a greater aspect ratio compared with that of a semiconductor device comparable to the present invention by an amount of the thickness of the second electrode 26. The passivation film 32 covering the third electrode 29 may be avoided to have portions having lesser thicknesses, degraded quality, and/or slits, which enhance the long-term reliability of the semiconductor device.

Also, as shown in FIG. 2C, the side of the second electrode 26 locates in a level thereof higher than the top surface of the first insulating film 21; that is, the second electrode 26 is formed so as to cover the edge of the first insulating film 21. Because the third electrode 29 is formed such that the mask 50 covers the side of the second electrode 26, the aspect ratio of the undercut 70 may become smaller.

The mask 50 is patterned such that the opening 52 in the width thereof becomes smaller than the width of the second electrode 26; that is, the mask 50 fully covers the side of the second electrode 26. Also, the second electrode 26 fully fills the opening 24 in the first insulating film 21; that is, the first electrode 17 exposing in the opening 24 is fully covered by the second electrode 26. Accordingly, even when the opening 52 of the mask 50 is narrower in the width thereof than the width of the opening 24 in the first insulating film 21, the misalignment of the opening 52 in the mask 50 does not expose the first electrode 17. The opening 52 of the mask 50 is preferably patterned narrower as far as the contact resistance and the adhesive strength of the third metal 29 to the second metal 26 satisfy respective conditions; which means that a narrower opening 52 of the mask 50 may enhance the alignment tolerance of the mask 50 to the second electrode 26.

The second electrode 26 may be formed by, for instance, the vacuum evaporation. Such an electrode may form the edge thereof in dull, or realize a tapered edge. The side 60 of the second electrode 26 with the tapered edge may enhance the covering of the third electrode 29 by the passivation film 32. The description above concentrates an arrangement of the semiconductor device primarily on the ohmic electrode. But the invention is not restricted to the ohimic electrode; and the invention is similarly applicable to other electrodes of the drain and the source.

In the foregoing detailed description, the method and apparatus of the present invention have been described with reference to specific exemplary embodiments thereof. However, it will be evident that various modifications and changes may be made thereto without departing from the broader spirit and scope of the present invention. The present specification and figures are accordingly to be regarded as illustrative rather than restrictive.

What is claimed is:

1. A method of producing a semiconductor device, comprising steps of:
    forming a first electrode on a semiconductor layer;
    forming a first insulating film on the first electrode, the first insulating film having an opening through which a portion of the first electrode exposes a periphery surrounding the opening;
    forming a second electrode on a portion of the first electrode exposed in the opening of the first insulating film and the periphery of the first insulating film, the second electrode forming a mound in a periphery thereof running on the periphery of the first insulating film;
    forming a mask on the first insulating film and the periphery of the second electrode, the mask having an opening that exposes the second electrode therein but covers an edge of the second electrode, the opening in the mask having a dulled edge;
    forming a third electrode on the mask and on the second electrode exposed from the mask by steps of,
        forming a seed metal on the mask and the second electrode that is exposed in the opening of the mask,
        forming another mask on the seed metal, the another mask having an opening that exposes the seed metal in the opening of the mask and on the mask in a periphery around the opening of the mask,
        electrolytic plating selectively on the second electrode exposed from the opening of the another mask by providing a current through the seed metal,
        removing the another mask so as to expose the third electrode, and
        removing the seed metal and the mask each exposed from the third electrode;
    exposing the edge of the second electrode by removing the mask; and covering the edge of the second electrode and an edge of the third electrode by a second insulating film,
wherein the second electrode and the third electrode form a cut in the respective edges and between the second electrode and the third electrode.

2. The method of claim 1,
wherein the step of forming the mask includes a step of forming the opening fully overlapped with the second electrode but narrower than the second electrode.

3. The method of claim 1,
wherein the step of forming the second electrode includes a step of forming the second electrode by vacuum evaporation.

4. The method of claim 1,
wherein the step of forming the second electrode includes a step of forming the second electrode wider than the opening of the first insulating film.

5. The method of claim 1,
wherein the step of forming the second electrode includes a step of forming the edge of the second electrode in a tapered shape.

6. The method of claim 1,
wherein the step of forming the mask includes a step of forming the opening in the mask so as to be aligned with the edge of the second electrode.

7. The method of claim 1,
wherein the step of forming the first electrode includes a step of forming an ohmic electrode on the semiconductor layer.

\* \* \* \* \*